(12) United States Patent
Janssens

(10) Patent No.: US 10,122,359 B2
(45) Date of Patent: Nov. 6, 2018

(54) INTEGRATED CIRCUIT CONTROL OF ANTI-SERIES SWITCHES

(71) Applicant: SEMICONDUCTOR COMPONENTS INDUSTRIES, LLC, Phoenix, AZ (US)

(72) Inventor: Johan Camiel Julia Janssens, Asse (BE)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 14/820,597

(22) Filed: Aug. 7, 2015

(65) Prior Publication Data

US 2017/0040993 A1 Feb. 9, 2017

(51) Int. Cl.
*H03K 17/687* (2006.01)
*H03K 19/173* (2006.01)

(52) U.S. Cl.
CPC ....... *H03K 17/687* (2013.01); *H03K 17/6874* (2013.01); *H03K 19/1732* (2013.01)

(58) Field of Classification Search
CPC ........... H03K 17/04123; H03K 17/687; H03K 17/6874; H03K 19/1732
See application file for complete search history.

(56) References Cited

U.S. PATENT DOCUMENTS

| | | | | |
|---|---|---|---|---|
| 4,686,383 | A | * | 8/1987 | Croft .................. H03K 17/0822 326/68 |
| 6,876,245 | B2 | * | 4/2005 | de Buda ............ H03K 17/6874 327/427 |
| 7,521,984 | B2 | | 4/2009 | Ricotti |
| 7,924,082 | B2 | | 4/2011 | Ricotti et al. |
| 2007/0273427 | A1 | | 11/2007 | Ricotti |
| 2009/0184744 | A1 | | 7/2009 | Ricotti et al. |
| 2012/0249216 | A1 | | 10/2012 | Ricotti et al. |
| 2014/0009189 | A1 | | 1/2014 | Mauder et al. |

* cited by examiner

*Primary Examiner* — Lincoln Donovan
*Assistant Examiner* — Colleen O Toole
(74) *Attorney, Agent, or Firm* — Ramey & Schwaller, LLP

(57) ABSTRACT

An integrated circuit controls one or more external back-to-back (anti-series) transistor switches with three pins per switch. Two pins couple the switch terminals of the external switch to terminals of an internal anti-series switch. An intermediate source node of the internal switch provides a reference voltage that is representative of the external switch's intermediate source node. A predriver of the integrated circuit drives a gate signal relative to the reference voltage, enabling fast, non-dissipative switching of the external switch. A disclosed method includes coupling switch terminal signals from an external anti-series switch to terminals of an internal anti-series switch; and driving a gate signal to the external anti-series switch relative to a reference voltage of an intermediate node of the internal anti-series switch.

20 Claims, 2 Drawing Sheets

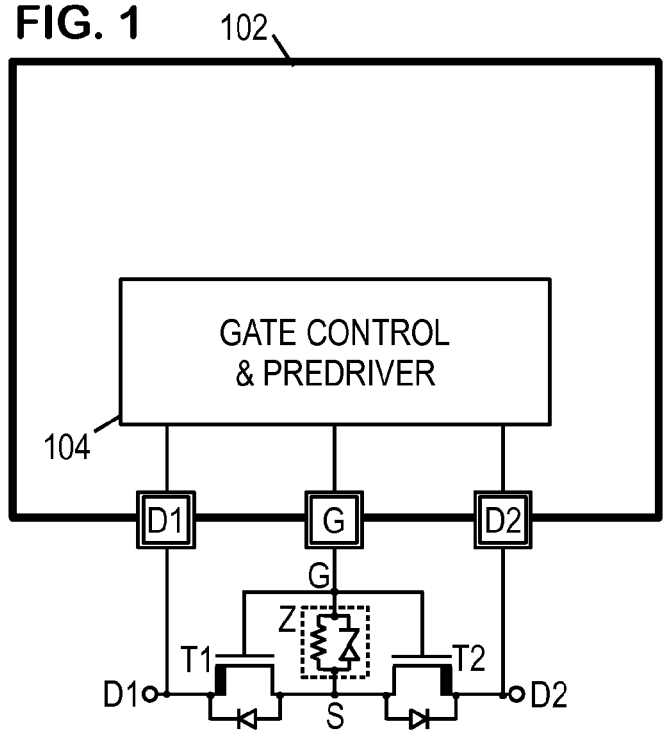
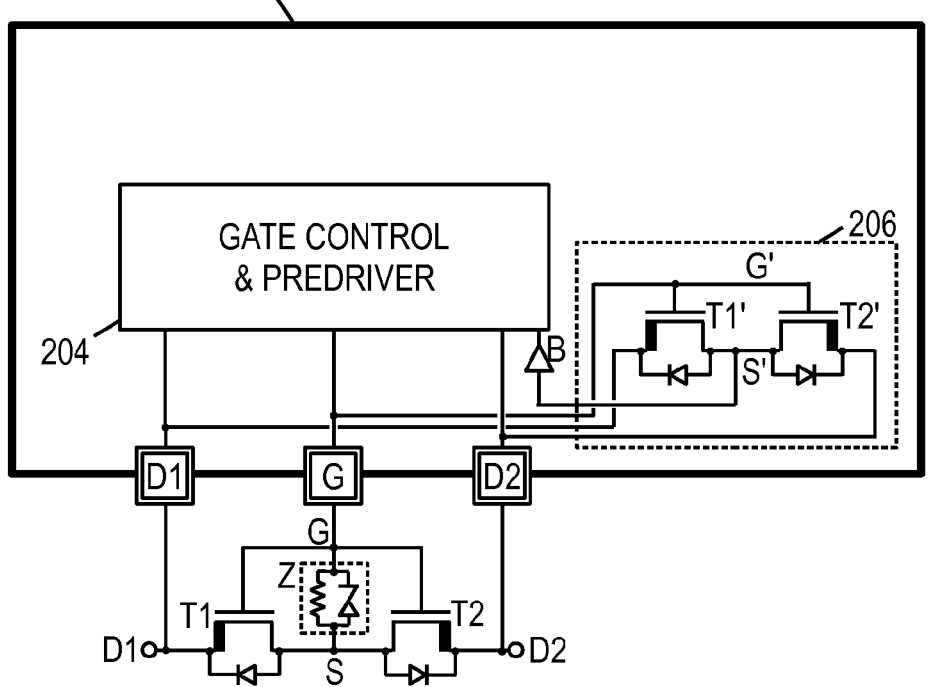

INTEGRATED CIRCUIT CONTROL OF ANTI-SERIES SWITCHES

BACKGROUND

Transistors, and in particular, metal-oxide-semiconductor field-effect transistors (MOSFETs), offer many desirable switch characteristics. Nevertheless, some of their characteristics may render their usage problematic in certain contexts. For example, the manufacturing process for MOSFETs produces internal junctions between p-type and n-type silicon, yielding parasitic diodes that must be taken into account. Normally one of these parasitic diodes is shorted out by coupling one of the MOSFET terminals to the "body", i.e., the bulk material of the semiconducting device. By convention, the terminal configured in this manner is designated as the source, while the terminal with the remaining parasitic diode is designated as the drain. Any failure to maintain the drain at a voltage substantially equal to or greater than the source results in excessive current flow through the parasitic diode, potentially resulting in damage to the device. This characteristic presents difficulties in switching applications where the voltage across the switch terminals is unknown or can change polarities.

A popular technique for addressing this difficulty is the use of an anti-series switch configuration, a configuration that employs two MOSFETS connected in series between the switch terminals with opposing orientations of their parasitic diodes. The intermediate node between the transistors can join their source nodes, or it can join their drain nodes. The intermediate source node configuration permits the use of a shared gate signal, whereas the intermediate drain node configuration necessitates individual gate signals for each transistor.

In applications requiring sensing of the switch terminal voltages (e.g., switching matrices, nondissipative balancing of battery banks), the anti-series switch is generally implemented as a four-terminal device. Specifically, when using the intermediate source node configuration, it is desirable to drive the shared gate terminal relative to the intermediate source node, thus requiring two terminals in addition to the switch terminals. Conversely, the intermediate drain node configuration requires two gate terminals in addition to the switch terminals, again yielding four terminals, and additionally requiring a second gate signal driver to boot. As the number of external anti-series switches increases, it becomes infeasible to provide four pins for each switch.

Various attempts have been made to implement the anti-series switch as a three terminal device by employing an intermediate source node configuration without a terminal connected to the intermediate node. Such configurations either suffer from poor switching performance or employ an undesirable number of external components to relate the gate terminal to the intermediate node voltage.

SUMMARY

Accordingly, there is disclosed herein integrated circuit configurations and methods for controlling external anti-series switches. In one embodiment, an integrated circuit controls one or more external back-to-back (anti-series) transistor switches with three pins per switch. Two pins couple the switch terminals of the external switch to terminals of an internal anti-series switch. An intermediate source node of the internal switch provides a reference voltage that is representative of the external switch's intermediate source node. A predriver of the integrated circuit drives a gate signal relative to the reference voltage, enabling fast, non-dissipative switching of the external switch. A disclosed method embodiment includes coupling switch terminal signals from an external anti-series switch to terminals of an internal anti-series switch; and driving a gate signal to the external anti-series switch relative to a reference voltage of an intermediate node of the internal anti-series switch.

BRIEF DESCRIPTION OF THE DRAWINGS

A better understanding of the various disclosed embodiments can be obtained when the following detailed description is considered in conjunction with the attached drawings, in which:

FIG. 1 shows an illustrative integrated circuit controlling an anti-series switch with a three-terminal configuration.

FIGS. 2A and 2B show variations of an improved embodiment of an integrated circuit for controlling an anti-series switch.

Figure 2B:
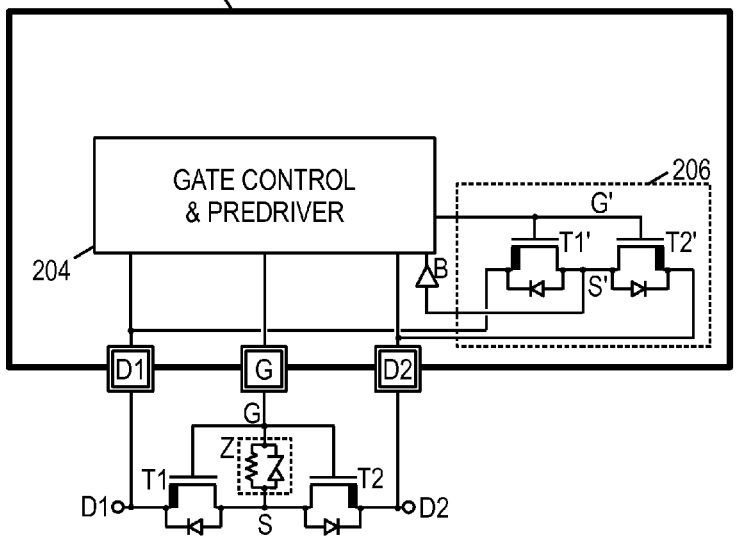

It should be understood that the drawings and corresponding detailed description do not limit the disclosure, but on the contrary, they provide the foundation for understanding all modifications, equivalents, and alternatives falling within the scope of the appended claims.

DETAILED DESCRIPTION

The disclosed techniques are best understood in context. Accordingly, FIG. 1 shows an illustrative integrated circuit 102 having a gate control & predriver circuit 104 coupled via three pins to an external anti-series switch having two back-to-back (BTB) transistors T1, T2. The transistors are p-type or n-type MOSFETs oriented with their parasitic body diodes in anti-series, preferably using a shared source configuration as shown. The orientation of body diodes shown in FIG. 1 is representative of an n-type anti-series switch, where the body diodes have shared anodes. With a p-type anti-series switch, the body diodes would have shared cathodes. In either case, the body diodes are prevented from circumventing the switching function, for whenever the polarity is such that one diode would be conducting, the other blocks the current (at least until a breakdown voltage is reached). The shared source configuration enables the transistors to be driven by a shared gate node G, thus requiring only one driver. (A shared drain configuration necessitates the use of two gate signals and thus two drivers.)

The ideal driving configuration for the gate signal employs a predriver whose ground is physically connected to the intermediate source node S. This configuration provides, for example, optimal control of discharge speed, maximal electromagnetic compatibility (EMC), insensitivity to capacitive coupling effects, and the ability to fully discharge the gate. However, as mentioned in the background, an anti-series switch with this driving configuration is a four terminal device. When many such external switches need to be controlled by an integrated circuit, the number of required pins becomes excessive.

Accordingly, the terminal for controlling the intermediate source node is omitted in FIG. 1. Instead, an impedance Z couples the shared gate node G to the intermediate source node S, enabling the external anti-series switch to be driven as a three-terminal device. The switch terminals D1, D2 are coupled via integrated circuit pins to the gate control & predriver circuit 104, which is preferably configured to employ the terminal voltages as part of a switching control process. The gate control & predriver circuit 104 drives the shared gate node G via a third integrated circuit pin. When the gate signal is asserted, the impedance Z limits the voltage between the shared gate node G and the intermediate source node S. When the gate signal is de-asserted, the impedance Z discharges the residual voltage between the gate and source nodes. (The illustrated impedance is a parallel combination of a resistor and a voltage limiter, but other impedance configurations are also suitable.)

The circuit designer faces an undesirable tradeoff when trying to select an appropriate resistance for Z. A high resistance value increases the RC time constant, which in turn limits the switching rate. Low resistance values suitable for fast switching applications increase current injection and energy dissipation and impair system efficiency. Another alternative is to increase the complexity of Z, perhaps introducing flip-flops and other discrete components. This alternative is considered undesirable due to the resultant increase in costs, occupied board space, and reliability risks.

Accordingly, FIG. 2A shows an improved integrated circuit 202 with a gate control & predriver circuit 204 and an internal anti-series switch 206. In contrast with the predriver circuit 104 (FIG. 1), the predriver circuit 204 drives the gate signal G relative to an intermediate source node S' of the internal anti-series switch 206. The internal switch 206 includes two transistors T1' and T2' in a shared source anti-series configuration between the switch terminals D1, D2, similar to the transistors of the external switch. The internal switch transistors T1', T2' further have a shared gate node G' coupled to the gate node G. (FIG. 2B shows a variation in which the internal gate node G' is driven separately from the external gate node G to increase flexibility, e.g., by enabling the use of lower voltage internal transistors, adjustable timing, or customization of other parameters.) When the internal switch transistors are reasonably matched to each other, the intermediate source node S' is expected to serve as a sufficiently precise mirror for the external switch's intermediate source node S. The internal switch transistors do not need to be matched to the external switch transistors, nor do they even need to be manufactured in the same process or semiconductor type as the external switch transistors.

An optional buffer amplifier B can be used to isolate the intermediate source node S' from loading by the predriver, enabling T1' and T2' to be small transistors. Another benefit of buffering the intermediate source node is the minimization of leakage current from the switch terminals, which may be important where low power consumption is needed or where currents may affect measurement accuracy, e.g., in battery monitoring applications. A potential disadvantage for buffering is the lengthening of the current loops, which may reduce EMC performance.

The embodiments of FIGS. 2A-2B retain the impedance Z between the gate and source nodes of the external switch, but this is optional. The impedance Z is no longer necessary for proper operation of the external switch, but may increase the tolerance for error between the intermediate source nodes S and S'. (S and S' need not be precisely matched, but rather need only be good enough for controlling the ON/OFF state of the external switch.) Where error is present, the predriver still controls most of the gate-to-source voltage range, with the resistance accommodating the residual discharge of the gate capacitance.

The impedance Z may also serve as a safety precaution against failure of the integrated circuit. In this role, the resistance of Z can be, e.g., increased to minimize energy dissipation. That is, the constraints and tradeoffs for selecting Z are greatly relaxed, enabling the designer to consider secondary performance issues such as cost and reliability.

Figure 3:
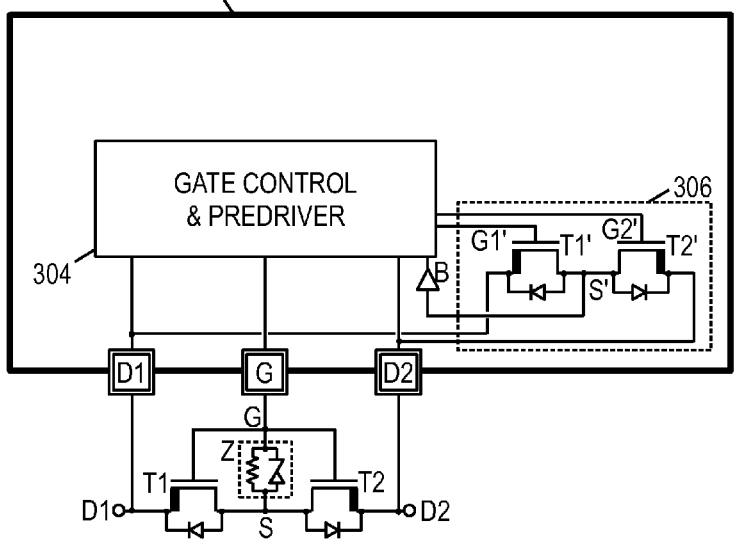
FIG. 3 shows an alternative embodiment of an integrated circuit for controlling an anti-series switch.

FIG. 3 shows an alternative embodiment, with an integrated circuit 302 having a modified gate control & predriver circuit 304 and a modified internal anti-series switch 306. In contrast with the embodiment of FIG. 2A, the internal anti-series switch 306 does not have a shared gate node coupled to the external switch's shared gate node. Rather, the internal switch transistors T1' and T2' have separate gates G1' and G2' that are driven by the gate control & predriver circuit 304 independently of each other and of the external gate node G. In practice, the signals are related, but the separation of the nodes enables greater control over the intermediate source node S' being used as the reference for driving the gate signal. In particular, this configuration can accommodate level shifting and scaling of the reference voltage.

In this fashion, a representative intermediate source node voltage (S') is made available for use as a local ground or ground reference for a predriver of the gate signal G for the external switch. (The term "ground reference" includes any reference voltage that is used to derive a node that serves as a local ground, such deriving including such operations as buffering and levelshifting.) The disclosed embodiments of FIGS. 2A-3 are thus enabled to provide fast, low-dissipation switching of external anti-series switches using only three IC pins per switch, thereby providing a substantial pin count reduction where multiple external switches are being controlled. Of course, where additional pins are available, the integrated circuit may provide a pin for optional connection to the source node of the external switch.

In addition to driving the gate signal G relative to the representative node S' voltage, the gate control & predriver circuits 204, 304 may further incorporate this representative node voltage as one of the bases for determining when to assert or de-assert gate signal G, e.g. as part of a synchronous rectifier, an active-balancing charge transfer controller, a DC/DC converter, or a switch with dV/dt control. For these purposes, the representative node voltage may be supplied to an amplifier, comparator, integrator, PID controller, or other such component of the control & predriver circuit.

Figure 4:
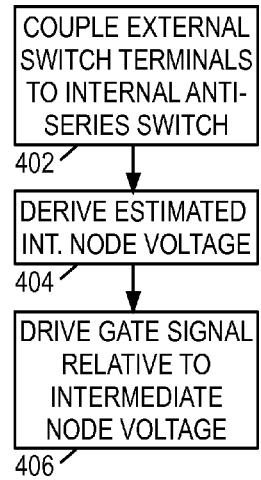
FIG. 4 is a flow diagram of an illustrative anti-series switch control method.

FIG. 4 is a flow diagram of an illustrative anti-series switch control method that may be implemented by an integrated circuit chip. In block 402, the chip couples the switch terminals of the external switch to terminals of an internal anti-series switch. In block 404, the integrated circuit applies one or more gate signals to the gates of the transistors of the internal switch, producing an intermediate source node voltage that is representative of the external switch's intermediate source node voltage. In block 406, the integrated circuit uses the representative node voltage as a reference for driving the gate signal to the external switch. (Though the foregoing operations are shown and discussed as if they occur in a sequential order, in practice they occur concurrently and may occur in an order other than that shown.)

As opposed to other driving methods that do not explicitly sense the source node of the external switch, this method provides greater degrees of freedom for the design of an integrated circuit predriver, enabling the designer to better optimize factors including switching speed, current injection, driving impedance, EMC emission, and loss during the transition time. A sufficiently accurate voltage estimate of intermediate source node S available for use as a local ground, further enables the gate signal predriver transistors to have lower breakdown voltages, as opposed to drivers required to drive the gate node relative to ground. EMC emission (and sensitivity) will be minimized, as the current loop is closed locally.

For explanatory purposes, the foregoing embodiments omit complicating factors such as parasitic impedances, current-limiting resistors, level-shifters, line clamps, power conditioning, etc., which may be present but do not meaningfully impact the operation of the disclosed circuits. These and numerous other modifications, equivalents, and alternatives, will become apparent to those skilled in the art once the above disclosure is fully appreciated.

For example, the foregoing description has presumed that the internal and external anti-series switches each consist of one back-to-back transistor pair. However, certain high-performance anti-series switches implement each of these transistors as a composite of multiple transistors in parallel or in series. In particular, the anti-series switches may be implemented as a back-to-back arrangement of two cascoded sets of transistors. The gates of this back-to-back cascoded transistor arrangement would typically need to be connected via a biasing network (e.g., resistors forming a voltage divider), but would still be controllable from with a single gate signal applied to the biasing network. With such an arrangement, the transistors recited in the claims would correspond to the innermost transistors forming a back-to-back pair.

As another example, where multiple external switches are being controlled by the integrated circuit, each may be provided with a respective internal switch that provides an estimated voltage of the intermediate source node. It is intended that the following claims be interpreted to embrace all such modifications, equivalents, and alternatives where applicable.

I claim:

1. An integrated circuit to control at least one off-chip anti-series switch having two transistors in series between two switch terminals, the transistors having their sources connected at an external intermediate node and their gates connected at a shared gate node, the integrated circuit comprising:
    a set of integrated circuit pins for coupling on-chip circuitry to off-chip components, the set including:
        a gate pin that couples to the shared gate node of said at least one off-chip anti-series switch;
        two terminal pins that couple to the two switch terminals of said at least one off-chip anti-series switch;
    an on-chip anti-series switch including two integrated transistors between the two terminal pins, the two integrated transistors operating to create an internal reference voltage on an internal intermediate node that connects their sources, the internal reference voltage mirroring a voltage of the external intermediate node without having a direct connection to the external intermediate node; and
    an on-chip controller with a predriver that drives the gate pin relative to the reference voltage.

2. The integrated circuit of claim 1, wherein the two integrated transistors are matched to each other.

3. The integrated circuit of claim 1, wherein the two integrated transistors have a shared gate terminal coupled to the gate pin.

4. The integrated circuit of claim 1, wherein the two integrated transistors have a shared gate node driven by the controller separately from the gate pin.

5. The integrated circuit of claim 1, wherein each of the two integrated transistors have a respective gate driven by a respective gate signal from the controller, wherein the respective gate signals are different from each other.

6. The integrated circuit of claim 1, wherein a buffered version of the reference voltage serves as local ground for the predriver.

7. The integrated circuit of claim 1, wherein the predriver receives as a local ground a level-shifted version of the reference voltage.

8. The integrated circuit of claim 1, wherein the controller asserts and de-asserts the gate pin based at least in part on voltages of the two terminal pins.

9. The integrated circuit of claim 1, wherein the controller asserts and de-asserts the gate pin based at least in part on the reference voltage.

10. The integrated circuit of claim 1, wherein the two integrated transistors have a lower gate breakdown voltage than the two transistors of the off-chip anti-series switch.

11. The integrated circuit of claim 1, wherein said set of integrated circuit pins is for driving one off-chip anti-series switch, and wherein the integrated circuit comprises multiple such sets of integrated pins, each set for driving a respective off-chip anti-series switch.

12. The integrated circuit of claim 11, wherein the integrated circuit comprises for each set of integrated circuit pins a corresponding internal anti-series switch.

13. A method for controlling an external off-chip anti-series switch having an external intermediate node, said controlling employing an integrated circuit that forgoes direct or short-circuit access to the external intermediate node, the method comprising:
    coupling switch terminal signals from the external anti-series switch to terminals of an internal anti-series switch of the integrated circuit;
    operating the internal anti-series switch to create, at an internal intermediate node connecting their sources, a reference voltage that mirrors a voltage of the external intermediate node without having a direct connection between the internal intermediate node and the external intermediate node; and
    driving a gate signal to the external anti-series switch relative to the reference voltage.

14. The method of claim 13, further comprising coupling the gate signal to a shared gate of integrated transistors forming the internal anti-series switch.

15. The method of claim 13, further comprising driving gates of the integrated transistors forming the internal anti-series switch separately from the gate signal to the external anti-series switch.

16. The method of claim 13, further comprising deriving a local ground for a predriver supplying the gate signal from a level-shifted version of the reference voltage.

17. The method of claim 13, further comprising buffering the reference voltage as a local ground for a predriver supplying the gate signal.

18. The method of claim 13, further comprising employing multiple internal anti-series switches to provide reference voltages representing intermediate node voltages of corresponding external anti-series switches.

19. The method of claim 18, wherein each intermediate node for the internal and external anti-series switches is a shared source node.

20. The method of claim 13, wherein said driving includes asserting and de-asserting the gate signal based at least in part on the reference voltage.

* * * * *